(12) United States Patent
Wischnewskiy et al.

(10) Patent No.: US 11,569,430 B2
(45) Date of Patent: Jan. 31, 2023

(54) METHOD FOR OPERATING AN ULTRASONIC MOTOR

(71) Applicant: PHYSIK INSTRUMENTE (PI) GMBH & CO. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 747 days.

(21) Appl. No.: 16/603,024

(22) PCT Filed: Apr. 4, 2018

(86) PCT No.: PCT/DE2018/100301
§ 371 (c)(1),
(2) Date: Oct. 4, 2019

(87) PCT Pub. No.: WO2018/184634
PCT Pub. Date: Oct. 11, 2018

(65) Prior Publication Data
US 2020/0035904 A1    Jan. 30, 2020

(30) Foreign Application Priority Data
Apr. 5, 2017 (DE) .......................... 102017107275.6

(51) Int. Cl.
*H01L 41/047* (2006.01)
*H01L 41/09* (2006.01)
(Continued)

(52) U.S. Cl.
CPC ...... *H01L 41/0471* (2013.01); *H01L 41/0913* (2013.01); *H02N 2/004* (2013.01);
(Continued)

(58) Field of Classification Search
CPC . H01L 41/0471; H01L 41/0913; H02N 2/004; H02N 2/0075; H02N 2/026; H02N 2/103
See application file for complete search history.

(56) References Cited

U.S. PATENT DOCUMENTS 5,616,980 A    4/1997  Zumeris
5,877,579 A    3/1999  Zumeris
(Continued)

FOREIGN PATENT DOCUMENTS

DE    102005010073 B4    5/2014
DE    102014205577 A1    10/2015

OTHER PUBLICATIONS

International Search Report (PCT/ISA/210) and translation and Written Opinion (PCT/ISA/237) dated Jul. 11, 2018, by the European Patent Office as the International Searching Authority for International Application No. PCT/DE2018/100301.
(Continued)

Primary Examiner — Emily P Pham
(74) Attorney, Agent, or Firm — Buchanan Ingersoll & Rooney PC

(57) ABSTRACT

Method for operating an ultrasonic motor with an ultrasonic actuator formed as a plate and an electrical excitation device. The ultrasonic actuator has at least four identical volume regions arranged symmetrically in relation to a transverse plane and in relation to a longitudinal plane, each volume region forming acoustic standing waves and static bending deformations. The electrical excitation device provides at least one electric alternating voltage and two static electric voltages the at least one alternating voltage U1 being applied in a dynamic operating mode simultaneously to two of the generators for forming an acoustic standing wave in the ultrasonic actuator, and the two static electric voltages being applied in a static operating mode simultaneously to all
(Continued)

Figure 1:
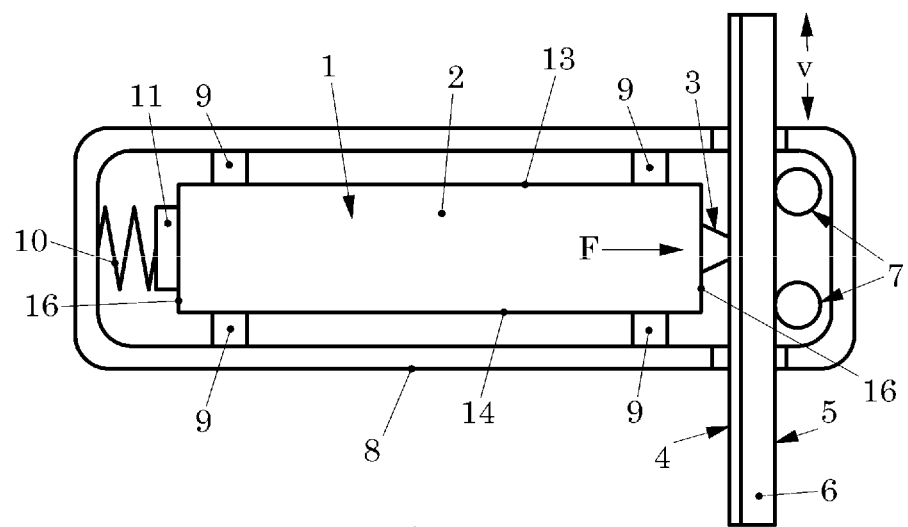

generators for forming a static bending deformation of the ultrasonic actuator.

4 Claims, 16 Drawing Sheets

(51) Int. Cl.
    *H02N 2/00*     (2006.01)
    *H02N 2/02*     (2006.01)
    *H02N 2/10*     (2006.01)

(52) U.S. Cl.
    CPC ........... *H02N 2/0075* (2013.01); *H02N 2/026* (2013.01); *H02N 2/103* (2013.01)

(56) References Cited

U.S. PATENT DOCUMENTS

| | | |
|---|---|---|
| 6,064,140 A | 5/2000 | Zumeris |
| 2004/0017134 A1 | 1/2004 | Ganor |
| 2006/0113866 A1 | 6/2006 | Ganor |
| 2016/0049572 A1 | 2/2016 | Hashimoto et al. |
| 2017/0214339 A1* | 7/2017 | Wischnewskiy ..... H02N 2/0075 |

OTHER PUBLICATIONS

Office Action (Communication) dated Sep. 28, 2021, by the European Patent Office in corresponding European Patent Application No. 18720088.6, and an English Translation of the Office Action. (7 pages).

* cited by examiner

METHOD FOR OPERATING AN ULTRASONIC MOTOR

The invention relates to a method for operating an ultrasonic motor according to claims 1 to 4.

A method for actuating or for operating an ultrasonic motor is known from DE 10 2005 010 073 B4 in which the motion control of the element to be driven is effected by the acoustic standing waves generated by the ultrasonic actuator present in the form of a rectangular plate and by the static bending of the ultrasonic actuator.

In the ultrasonic actuator, acoustic bending standing wave that propagate along its length L and along its height H as well as acoustic longitudinal standing waves that propagate along its length L are generated.

The thickness B of the piezoelectric plate of the ultrasonic actuator is limited for technical reasons to the value H/4, which is why it is impossible for the ultrasonic motor known from DE 10 2005 010 073 B4 to realize a length of the friction contact that is greater than H/4. As a result, the maximum force and the respective mechanical power that can be generated by the ultrasonic motor are limited.

If there is a requirement for higher drive forces or for higher mechanical power, two or more ultrasonic motors connected or coupled in parallel can be used.

However, one drawback of such coupling is that the ultrasonic motors in practice exhibit a relatively large spread in terms of operating (resonance) frequencies. This is due to the spread of the density and hardness of piezoelectric ceramics arising for technological reasons during the production of ultrasonic actuators.

The difference in the operating frequencies of the individual ultrasonic motors leads to a reduction in the overall power of the ultrasonic motors connected in parallel and to unstable operation due to a transmission or a transition of the operating frequency of one motor to another motor.

In addition, the use of several motors entails higher costs.

It is therefore the object of the invention to provide a method for operating an ultrasonic motor in which an ultrasonic motor can be realized with higher driving force, more mechanical power and a higher operating stability as compared to the methods known from prior art.

This object is satisfied with a method for operating an ultrasonic motor according to claim 1, where the subsequent dependent claims 2 to 4 represent at least advantageous further developments.

The method according to the invention is divided into the following steps.

providing an ultrasonic actuator made of piezoelectric or electrostrictive or magnetostrictive material in the form of a plate whose width B is greater than its thickness D and smaller than its length L, and the plate comprises two main faces, two side faces extending along the length and two end faces extending along the width, and a transverse plane of symmetry S1 which runs perpendicular to the main faces and the side faces and parallel to the end faces, and a longitudinal plane of symmetry S2 which runs perpendicular to the side faces and the end faces and parallel to the main faces, where a friction element intended for contacting an element to be driven is arranged on at least one of the end faces of the ultrasonic actuator, and the ultrasonic actuator comprises at least four identical volume regions which are arranged symmetrically in relation to the transverse plane of symmetry S1 as well as symmetrically in relation to the longitudinal plane of symmetry S2, and each of the volume regions together with excitation electrodes and general electrodes arranged on and/or in the ultrasonic actuator forms a generator for forming acoustic standing waves as well as a generator for forming static bending deformations;

providing an electrical excitation device which delivers only one electric alternating voltage U1 or two electric alternating voltages U1, U2 and additionally two static electric voltages E1, E2;

applying the alternating voltage U1 to the electrodes of two of the four generators G1, G2, G3, G4 or applying one of the two alternating voltages U1, U2 to the electrodes of two of the generators G1, G2, G3, G4 and applying the other alternating voltage U1, U2 to the electrodes of the two other generators G1, G2, G3, G4 for forming an acoustic standing wave in the ultrasonic actuator in a dynamic operating mode, or applying one of the two static electric voltages E1, E2 to the electrodes of two of the four generators G1, G2, G3, G4 and applying the other static electric voltage E1, E2 to the electrodes of the other two generators G1, G2, G3, G4 for forming a static bending deformation in a static operating mode.

The dynamic operating mode and the static operating mode are performed independently of each other and can preferably be performed successively such that the dynamic operating mode is followed by the static operating mode.

Within the dynamic operating mode, either the only alternating voltage U1 is simultaneously applied to two of the four generators G1, G2, G3, G4 or each of the two alternating voltages U1, U2 to a pair of generator consisting of two interacting generators, i.e. for example U1 to G1 and G4 and U2 to G2 and G3, for forming an acoustic standing wave in the ultrasonic actuator, while in a static operating mode, the two static electric voltages E1, E2 are simultaneously applied to all four generators G1, G2, G3, G4 for forming a static bending deformation of the ultrasonic actuator.

It can be advantageous that in the dynamic operating mode, when applying the two alternating voltages U1, U2, each of the two pairs of generators, to which the same alternating voltage U1, U2 is applied, forms an acoustic standing wave in the ultrasonic actuator which corresponds to a superposition of the second mode of a bending standing wave and the first mode of a longitudinal standing wave.

But it can also be advantageous that in the dynamic operating mode, when applying the two alternating voltages U1, U2, one of the two pairs of generators, to which one of the alternating voltages U1, U2 is applied, forms an acoustic standing wave in the ultrasonic actuator which corresponds to the second mode of the bending standing wave, and the other of the two pairs of generators, to which the other alternating voltage U1, U2 is applied, forms an acoustic standing wave in the ultrasonic actuator which corresponds to the first mode of an acoustic longitudinal standing wave.

It can be advantageous to have the static bending deformation of the ultrasonic actuator take place in a plane that runs substantially parallel to the end faces.

It can further be advantageous to have the ratio of length L to thickness D of the ultrasonic actuator be in the range between 3.5 and 4.5.

It can also be advantageous to have the surfaces formed by the elliptical trajectories of points of the friction element or by the direction of motion of an element to be driven by the ultrasonic motor be arranged perpendicular to the main faces of the ultrasonic actuator.

Furthermore, it can be advantageous to have generators G1, G2, G3, G4 for forming acoustic standing waves and for forming static bending deformations each be formed by strip-shaped excitation electrodes and strip-shaped general electrodes arranged alternately on the two main faces, where the strip-shaped electrodes run parallel to the transverse plane of symmetry S1 and the polarization direction of the piezoelectric or electrostrictive or magnetostrictive material arranged between the strip-shaped electrodes runs perpendicular to the strip-shaped electrodes.

It can there be advantageous to have the distance between adjacent strip-shaped electrodes be equal to or less than half the thickness D of the ultrasonic actuator.

In addition, it can be advantageous to have the generators for forming acoustic standing waves and for forming static bending deformations be formed from flat, excitation electrodes separated from each other and arranged on the two main faces and a single planar general electrode which is arranged within the ultrasonic actuator coinciding with the latter's longitudinal plane of symmetry S2, where the polarization direction of the piezoelectric or electrostrictive or magnetostrictive material arranged between the planar electrodes runs perpendicular to the planar electrodes.

In addition, it can be advantageous to have the ultrasonic motor comprise clamping elements for holding the ultrasonic actuator, where the clamping elements are arranged in the regions of the minima of the oscillation velocities of acoustic bending standing waves excited in the ultrasonic actuator.

Further details of the invention shall be described in the drawings by way of schematically illustrated embodiments, where FIG. 1: shows an embodiment of an ultrasonic motor in the form of a linear drive suitable for operation according to the method of the invention.

Figure 2:
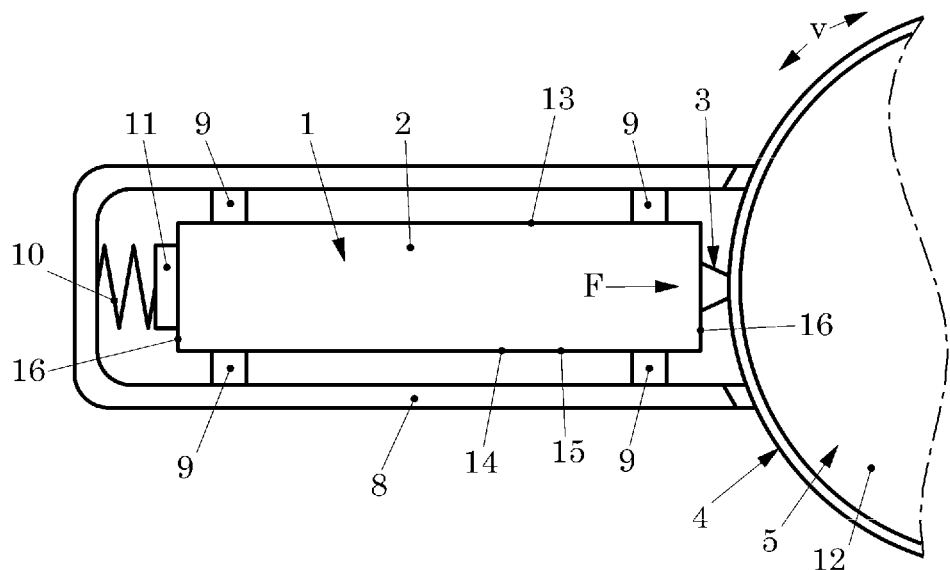

FIG. 2: shows an embodiment of an ultrasonic motor in the form of a rotary drive suitable for operation according to the method of the invention.

Figure 3:
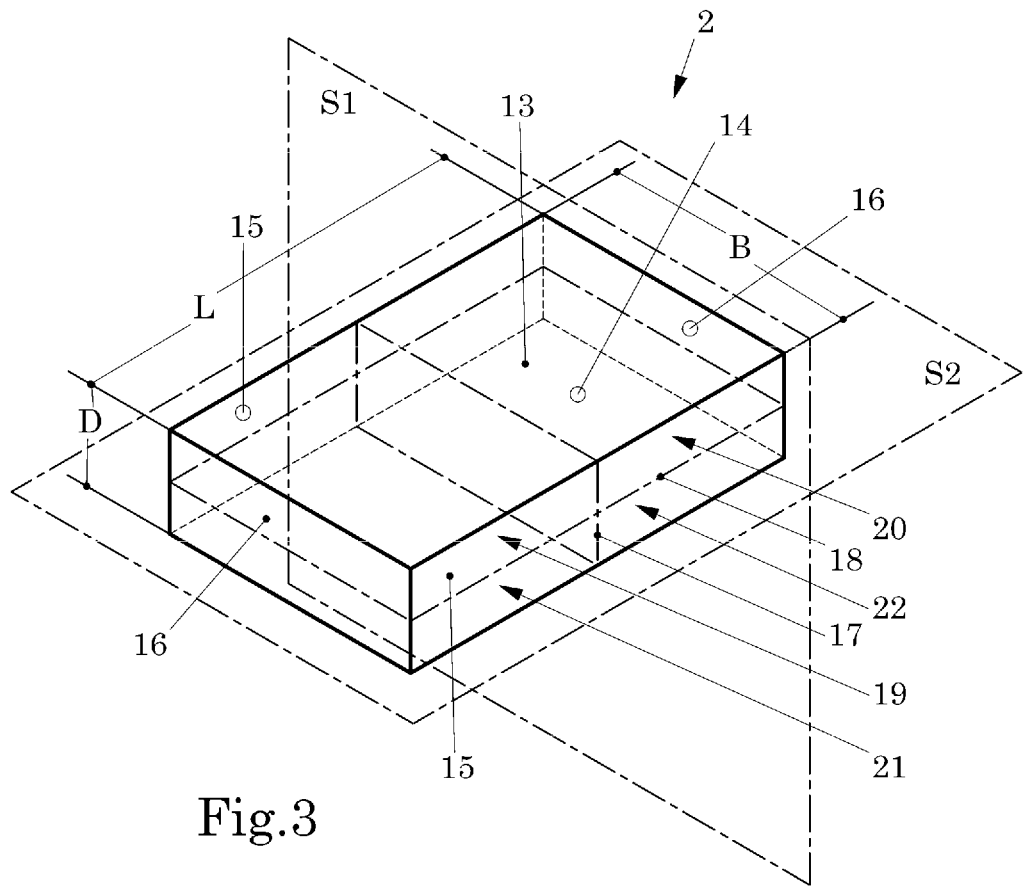

FIG. 3: shows the geometric structure of an ultrasonic actuator of an ultrasonic motor suitable for operation with the method according to the invention.

Figure 4:
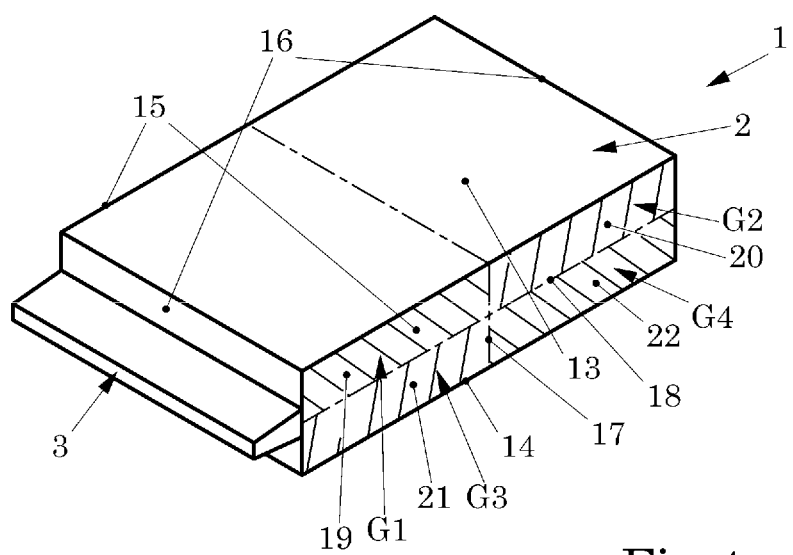

FIG. 4: shows an ultrasonic actuator according to FIG. 3 with a friction element arranged on one of the former's end faces.

Figure 5:
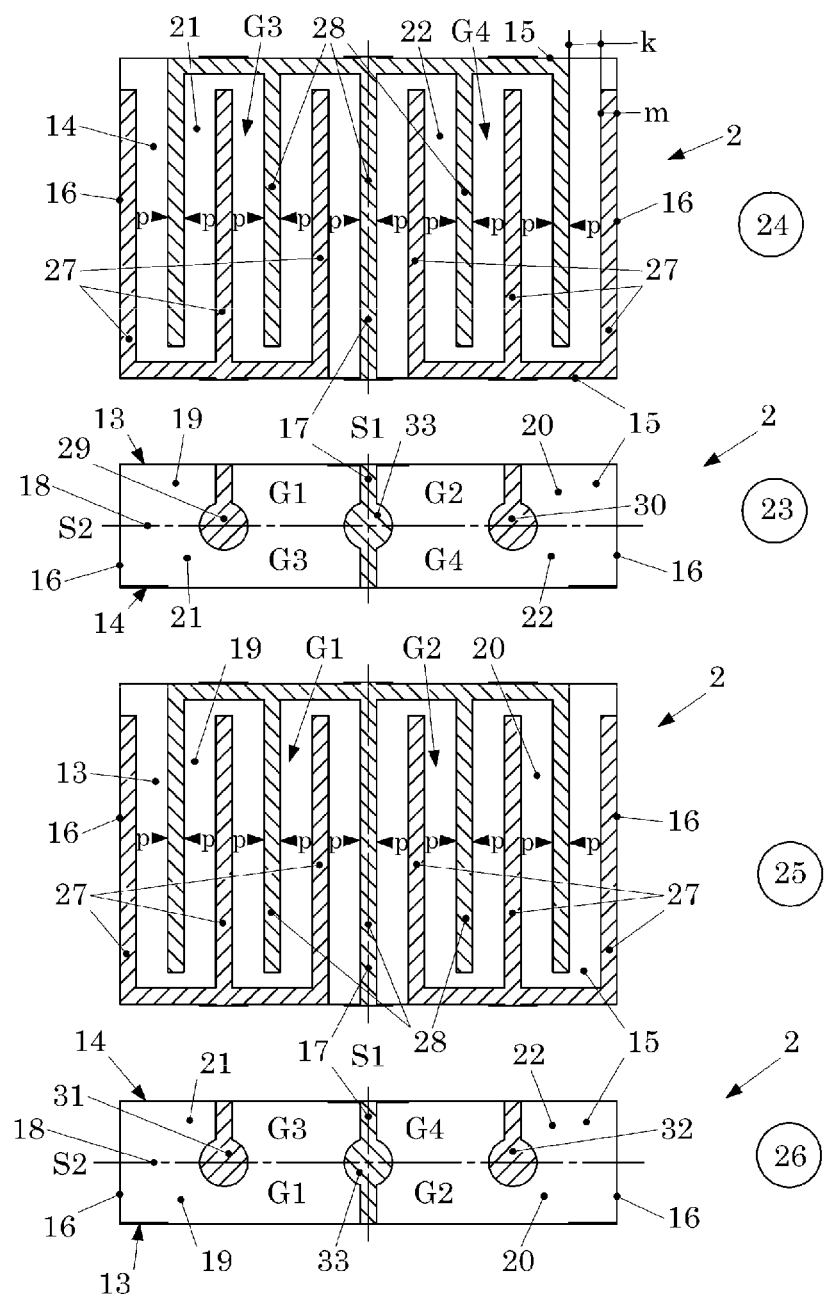

FIG. 5, illustrations 23 to 26: shows different views of an ultrasonic actuator according to FIGS. 3 and 4 with a possible embodiment of the electrodes of the ultrasonic actuator.

Figure 6:
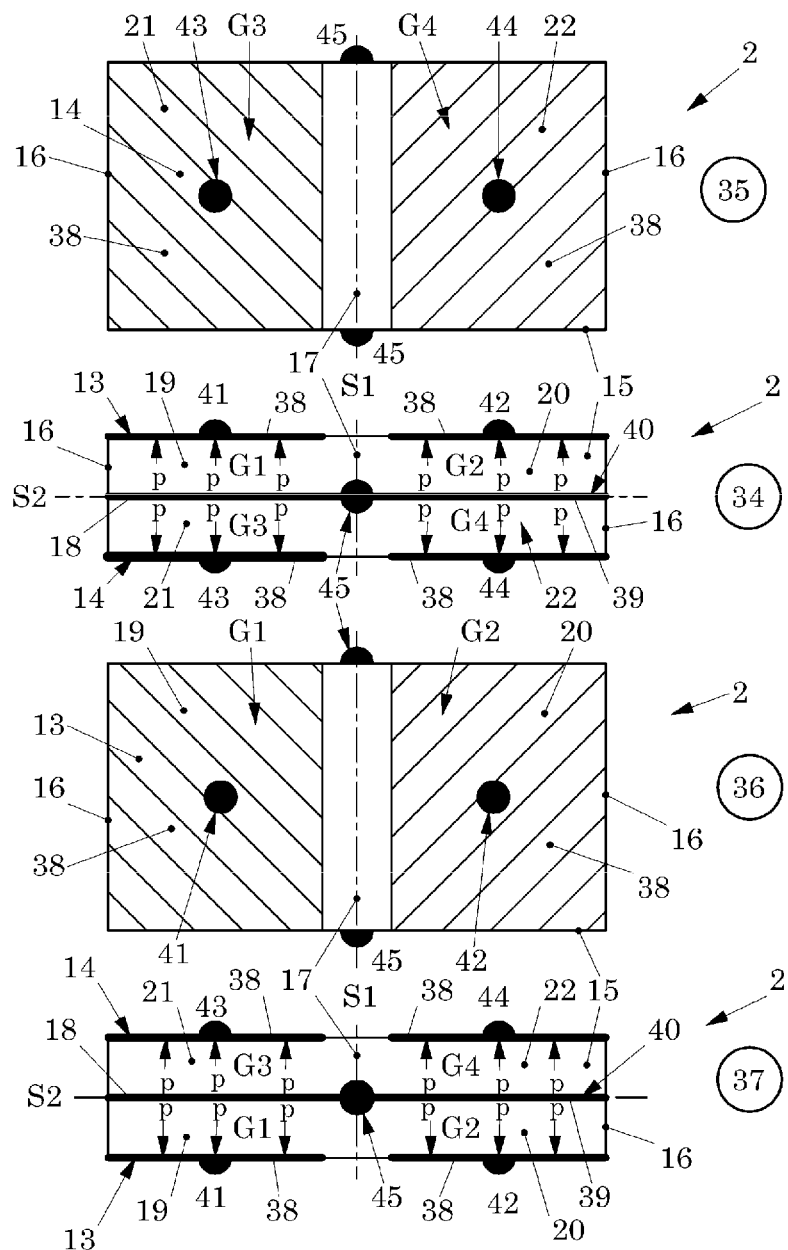

FIG. 6, illustrations 34 to 37: shows different views of an ultrasonic actuator according to FIGS. 3 and 4 with a further possible embodiment of the electrodes of the ultrasonic actuator.

Figure 7:
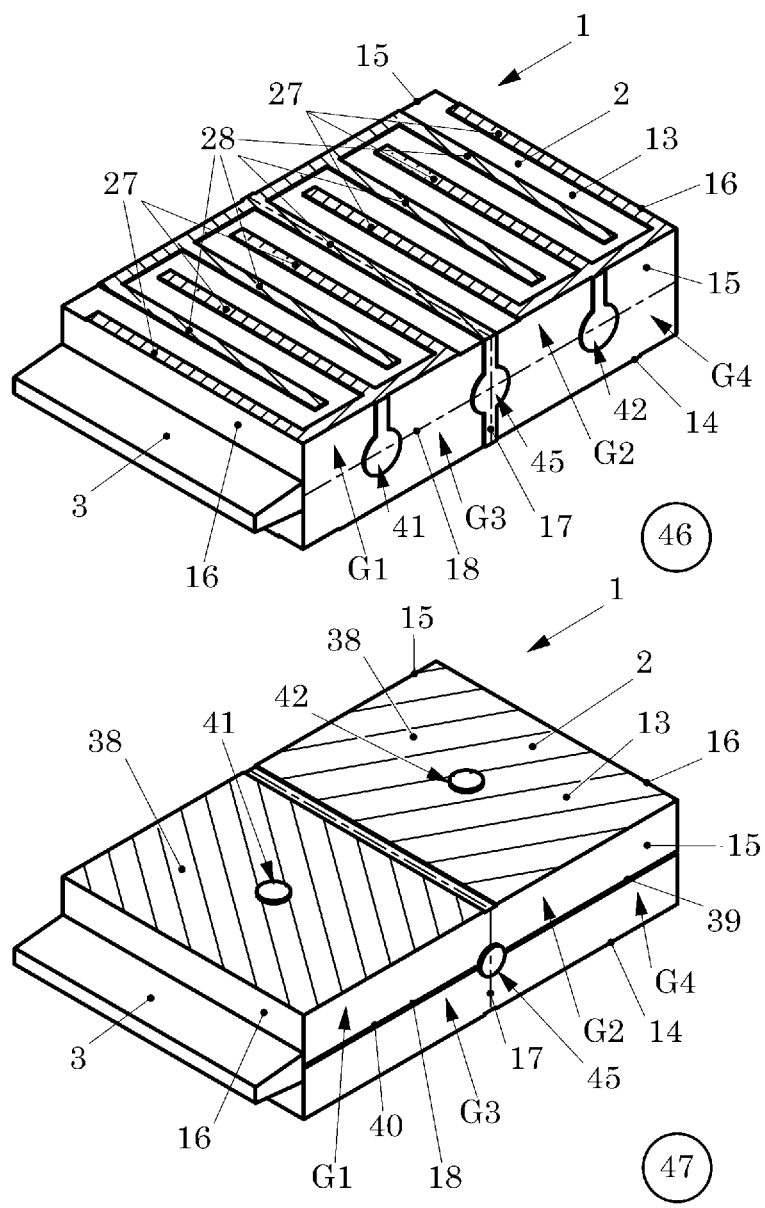

FIG. 7, illustration 46: shows a perspective view of the ultrasonic actuator according to FIG. 5 with a friction element arranged on one of the former's end faces; illustration 47: shows a perspective view of the ultrasonic actuator according to FIG. 6 with a friction element arranged on one of the latter's end faces.

Figure 8:
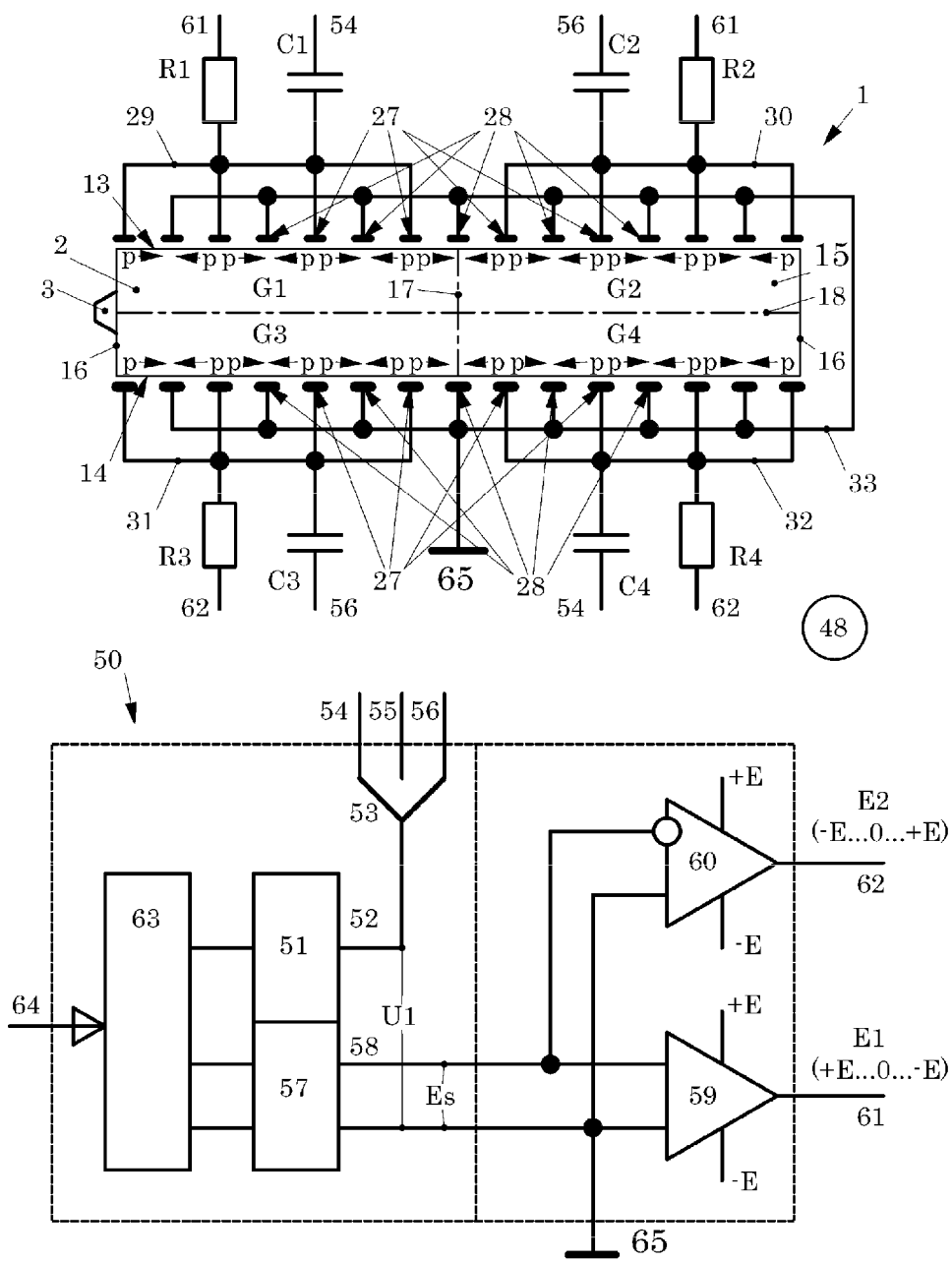

FIG. 8, illustration 48: shows an electric circuit for the operation of the ultrasonic actuator according to FIG. 5 with the method according to the invention using a single alternating voltage U1; illustration 49: shows a block diagram with an electrical excitation device for performing the method according to the invention using a single alternating voltage U1.

Figure 9:
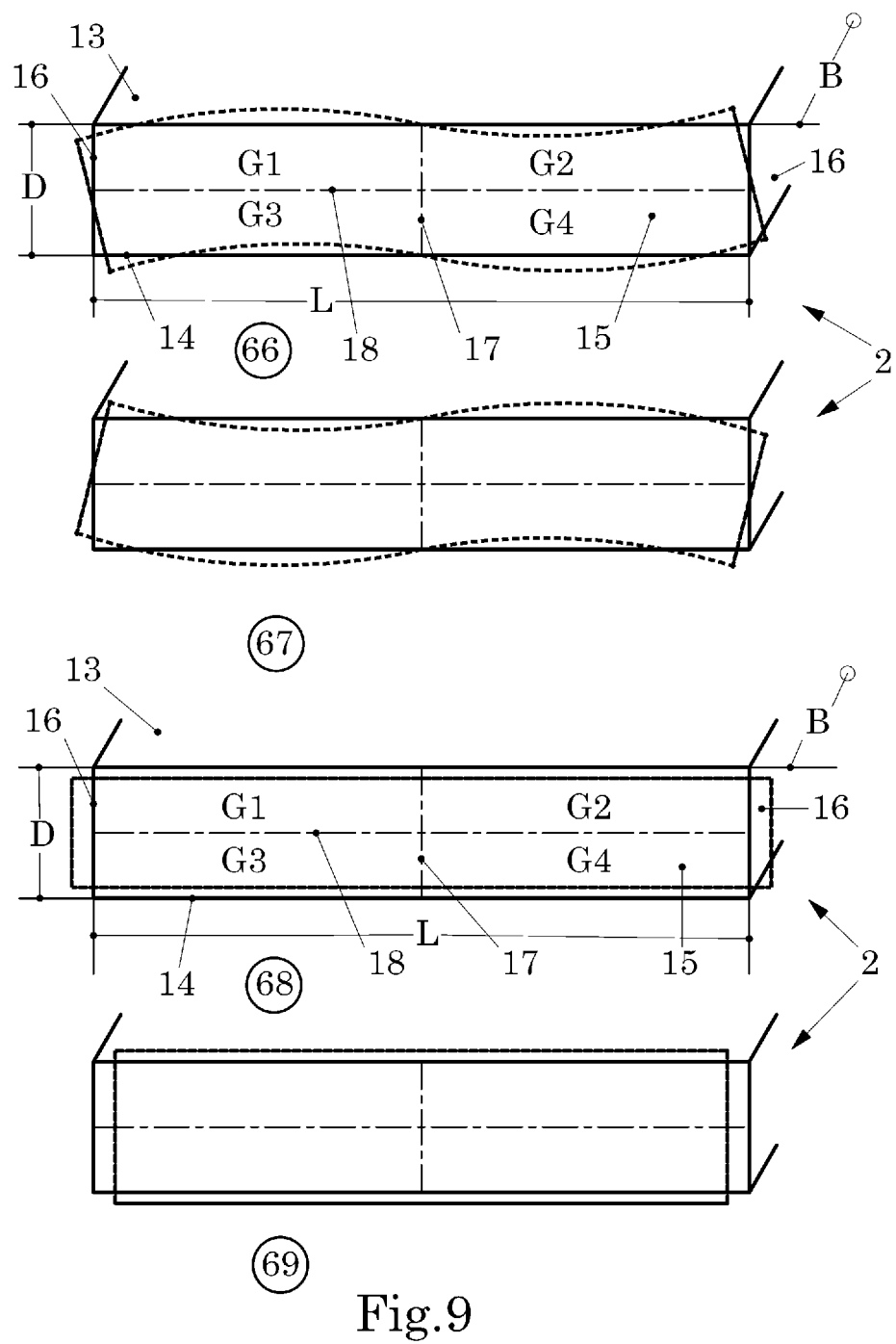

FIG. 9, illustrations 66 and 67: show states of maximum deformation due to the second mode of a bending standing wave (dynamic operating mode) formed in an ultrasonic actuator actuated according to the method of the invention; illustrations 68 and 69: states of maximum deformation due to the first mode of a longitudinal standing wave (dynamic operating mode) formed in an ultrasonic actuator actuated according to the method of the invention.

Figure 10:
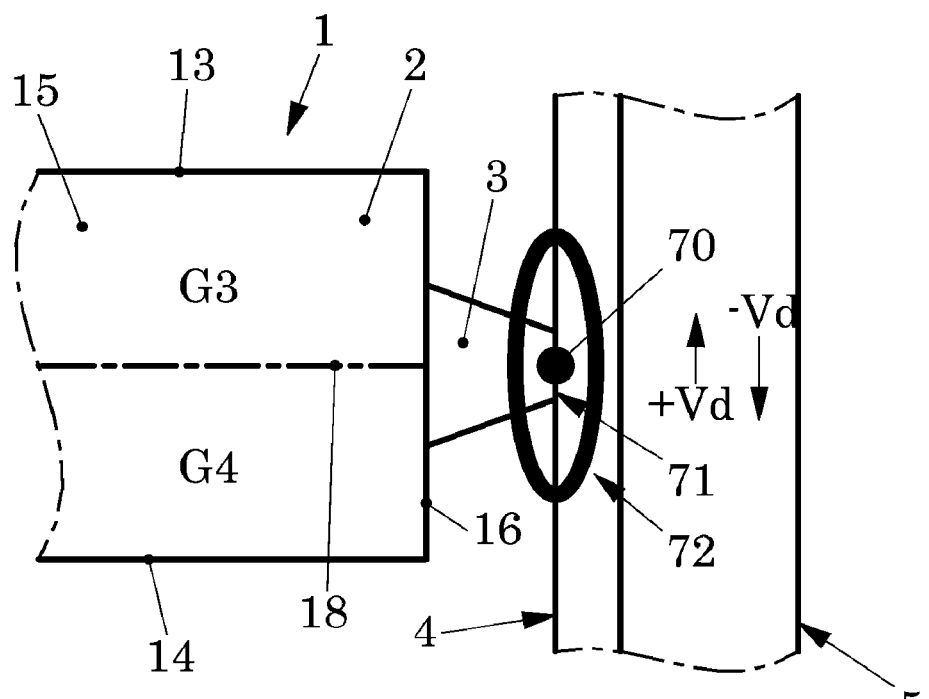

FIG. 10: shows an illustration of a possible motion trajectory of a point of the friction element of an ultrasonic actuator actuated according to the method of the invention (dynamic operating mode).

Figure 11:
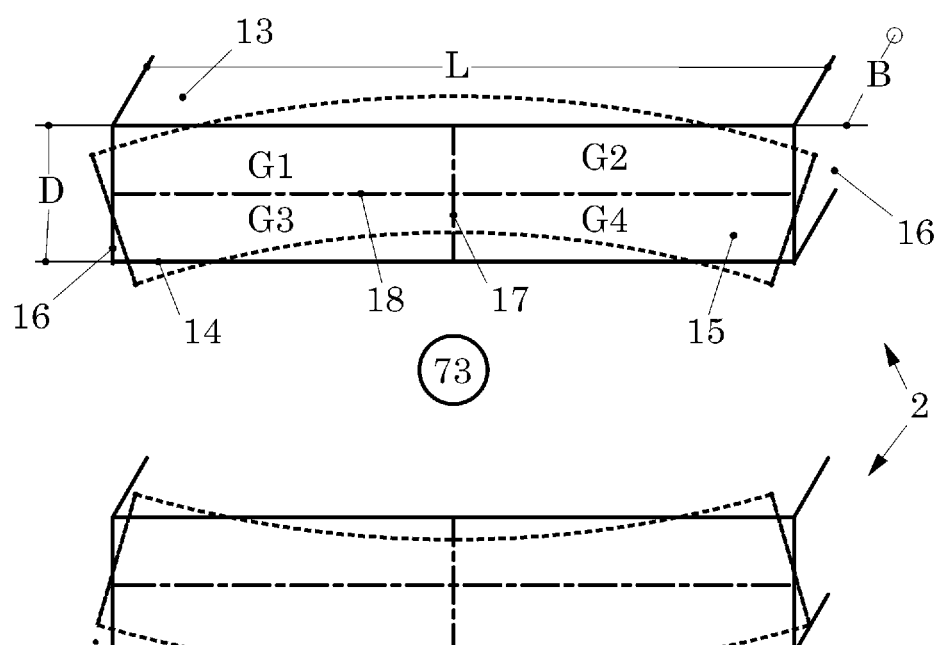

FIG. 11, illustrations 73 and 74: show states of maximum deformation due to the static bending deformation (static operating mode) formed in an ultrasonic actuator actuated according to the method of the invention.

Figure 12:
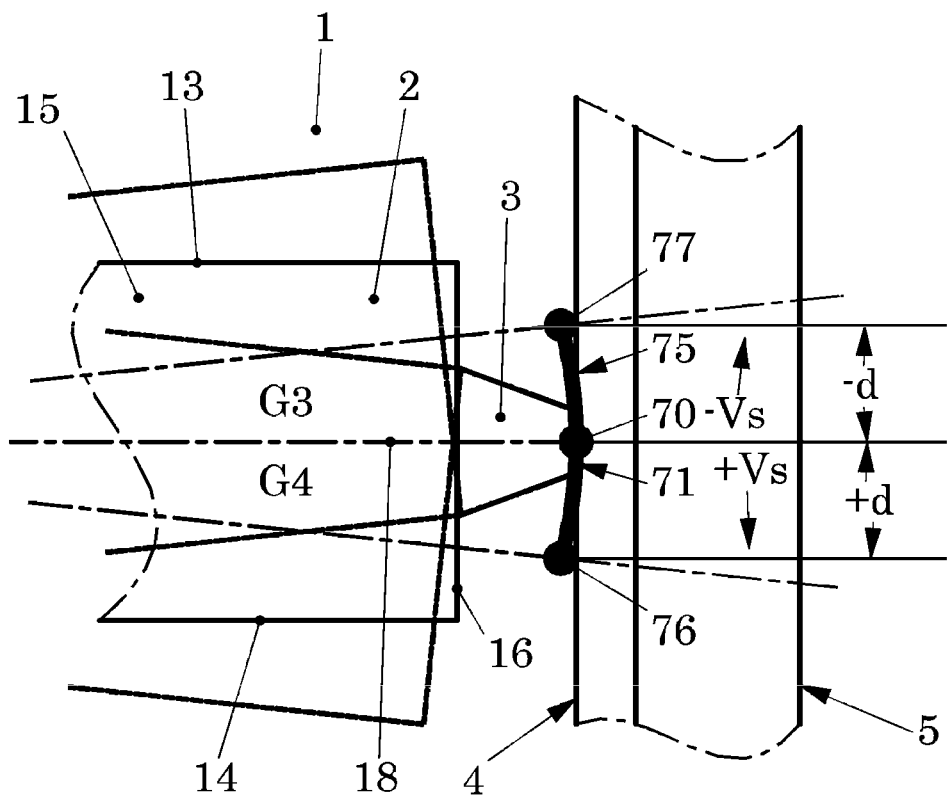

FIG. 12: shows an illustration of a possible motion trajectory of a point of the friction element of an ultrasonic actuator actuated according to the method of the invention (static operating mode).

Figure 13:
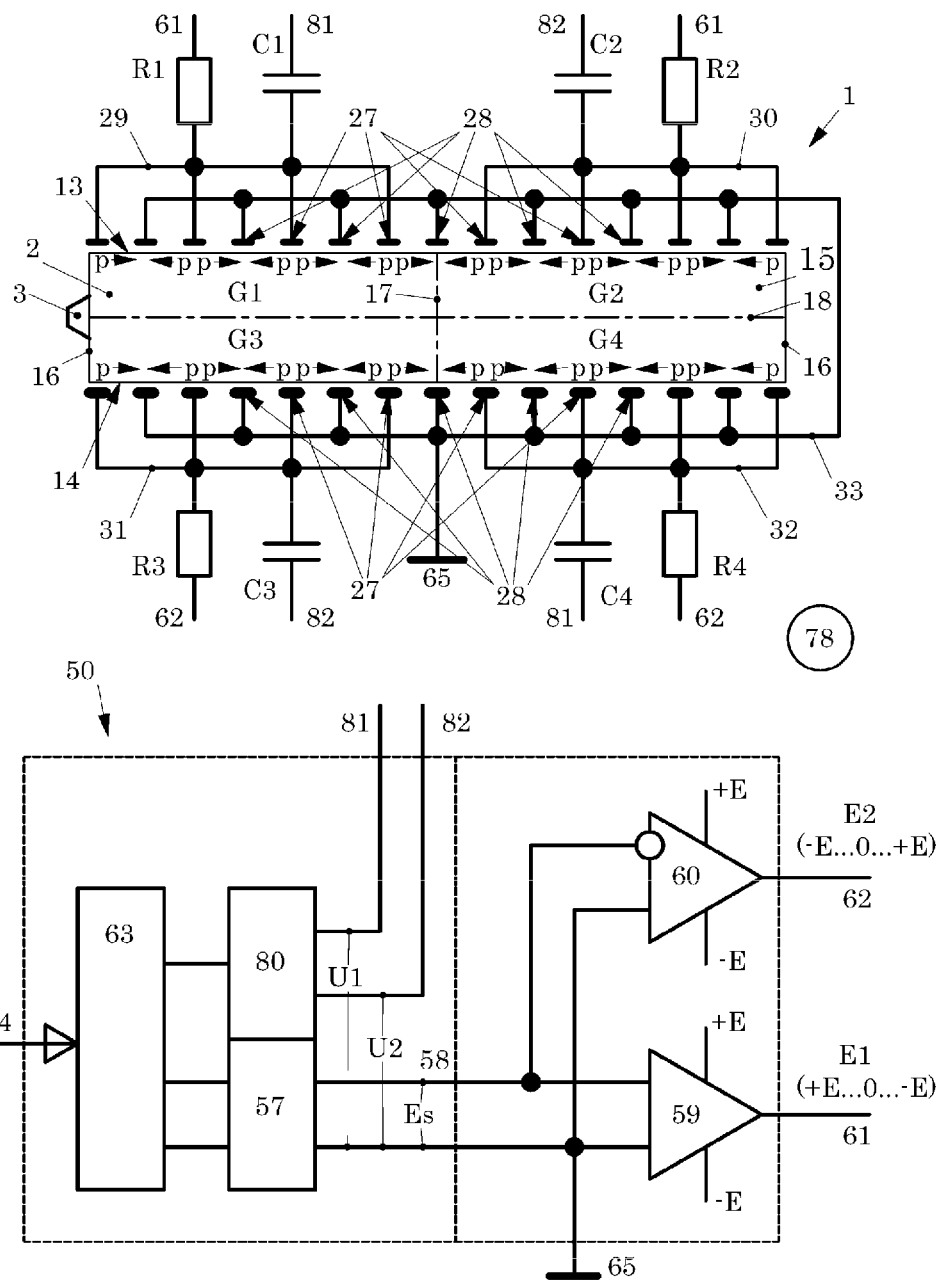

FIG. 13, illustration 78: shows an electric circuit for the operation of the ultrasonic actuator according to FIG. 5 with the method according to the invention using two alternating voltages U1 and U2; illustration 79: shows a block diagram with an electrical excitation device for performing the method according to the invention using two alternating voltages U1 and U2.

Figure 14:
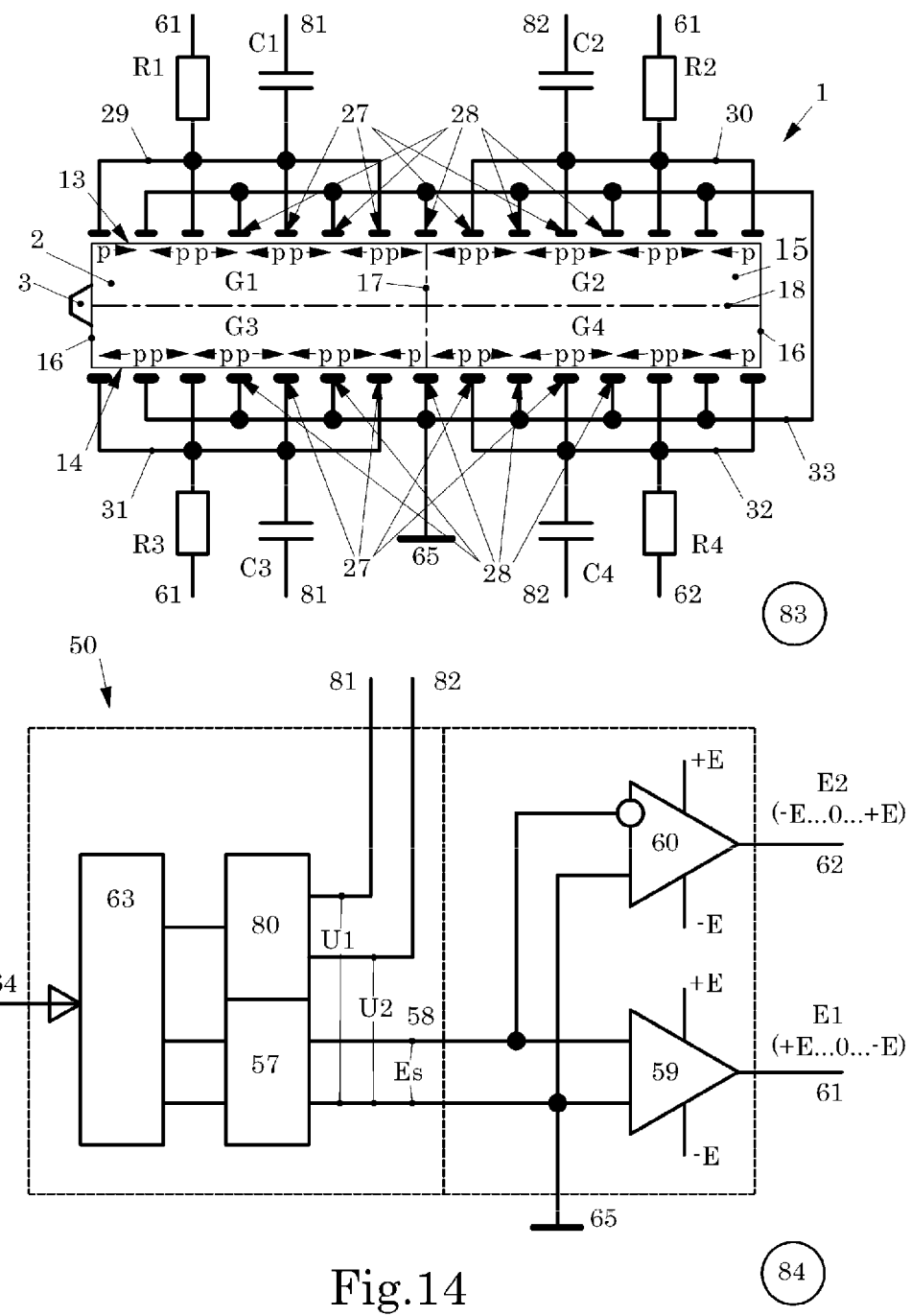

FIG. 14, illustration 83: shows an electric circuit for the operation of the ultrasonic actuator according to FIG. 5 with the method according to the invention using two alternating voltages U1 and U2; where each of the alternating voltages generates an independent standing wave in the ultrasonic actuator; illustration 84: shows a block diagram with an electrical excitation device for performing the method according to the invention using two alternating voltages U1 and U2.

Figure 15:
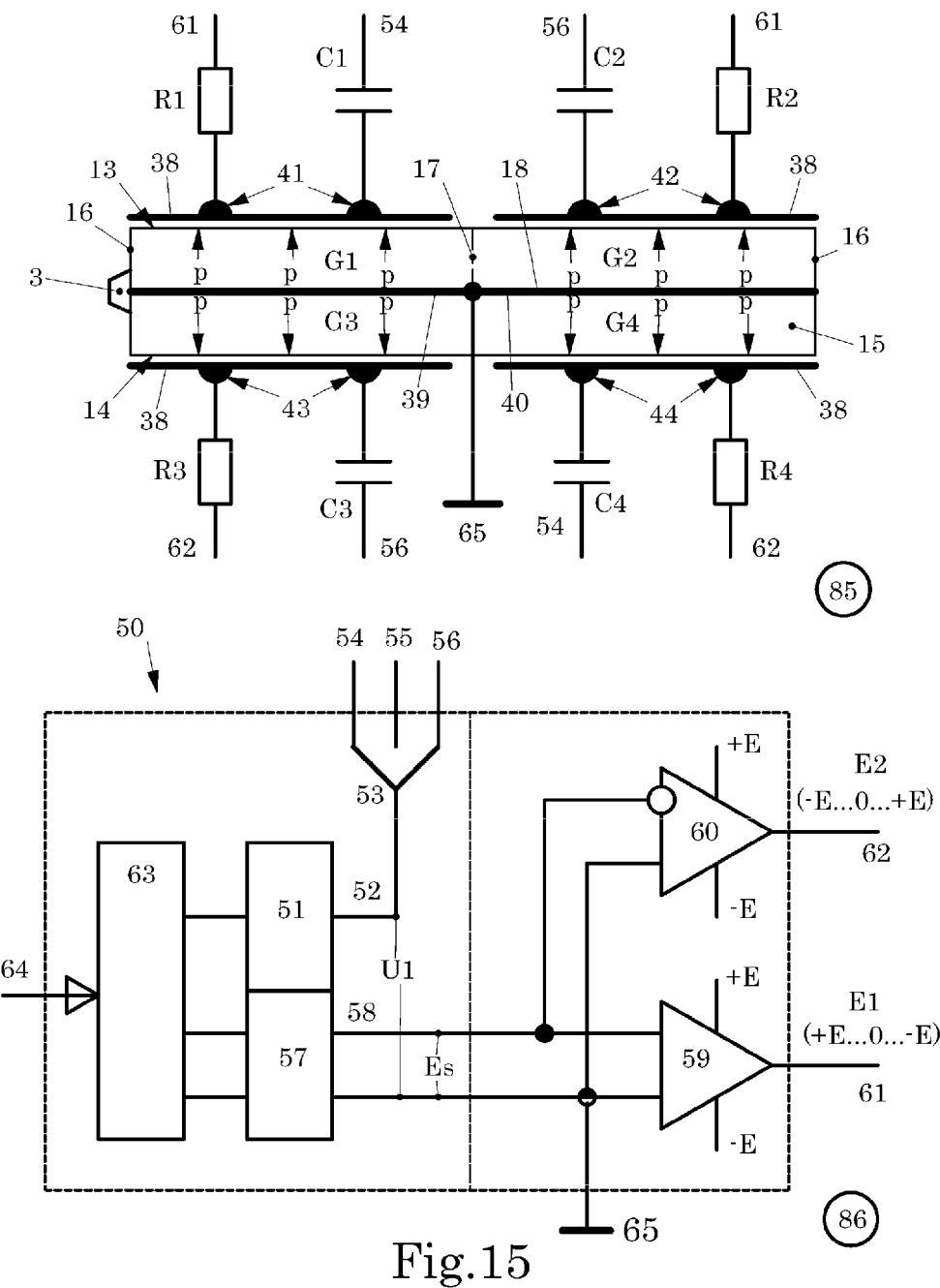

FIG. 15, illustration 85: shows an electric circuit for the operation of the ultrasonic actuator according to FIG. 6 with the method according to the invention using a single alternating voltage U1; illustration 86: shows a block diagram with an electrical excitation device for performing the method according to the invention using a single alternating voltage U1.

Figure 16:
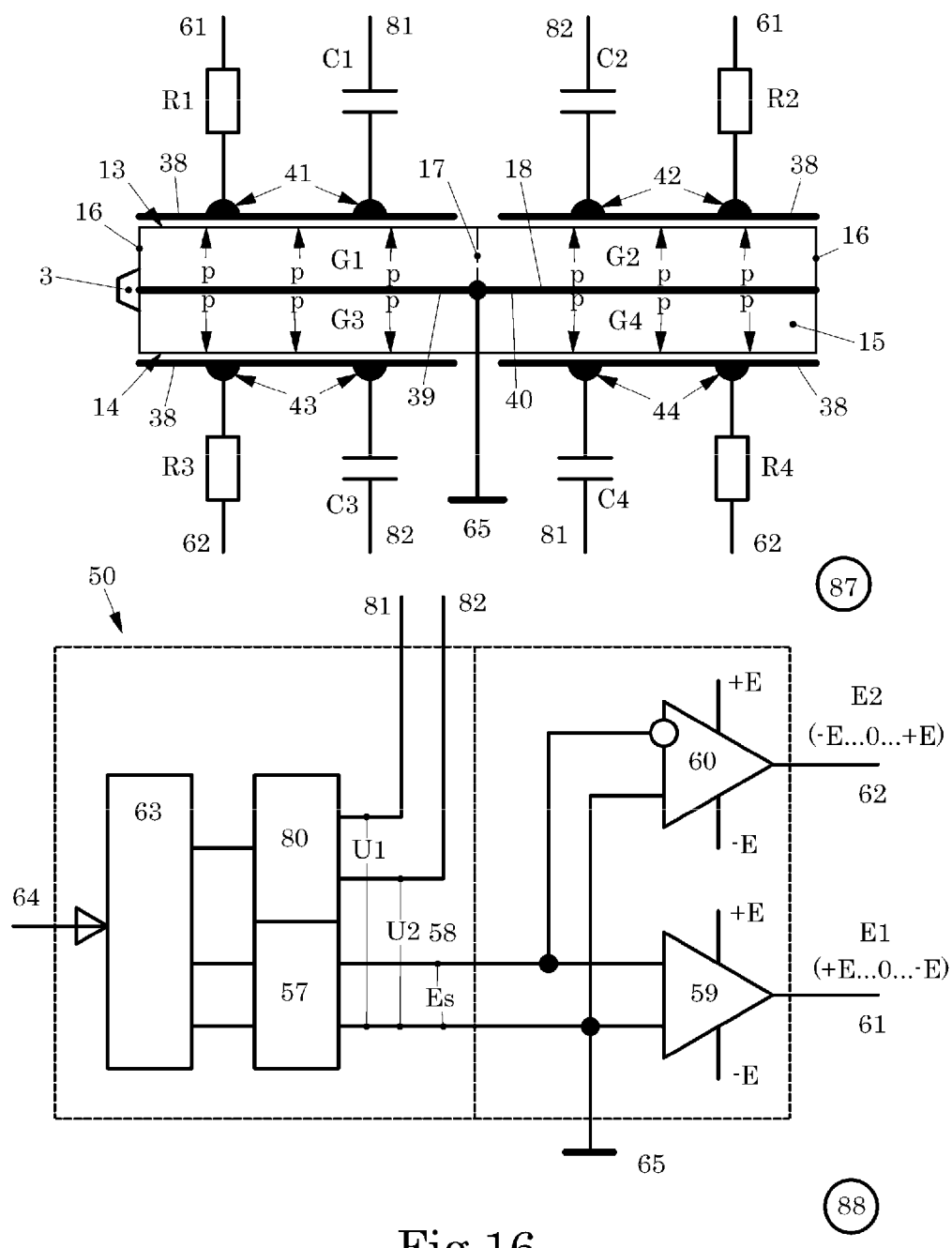

FIG. 16, illustration 87: shows an electric circuit for the operation of the ultrasonic actuator according to FIG. 6 with the method according to the invention using two alternating voltages U1 and U2; illustration 88: shows a block diagram with an electrical excitation device for performing the method according to the invention using two alternating voltages U1 and U2.

Figure 17:
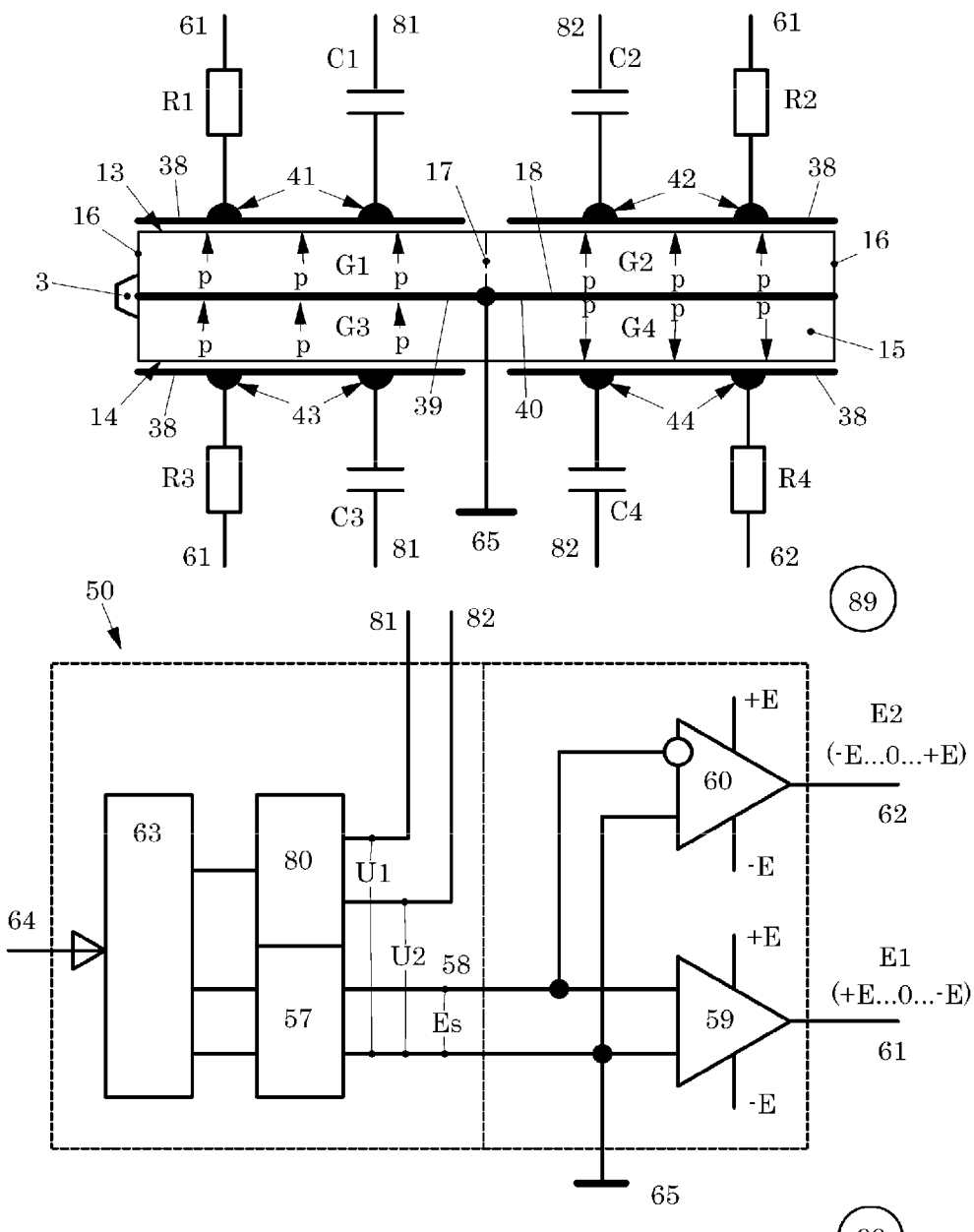

FIG. 17, illustration 89: shows an electric circuit for the operation of the ultrasonic actuator according to FIG. 6 with the method according to the invention using two alternating voltages U1 and U2; where each of the alternating voltages generates an independent standing wave in the ultrasonic actuator; illustration 90: shows a block diagram with an electrical excitation device for performing the method according to the invention using two alternating voltages U1 and U2.

Figure 18:
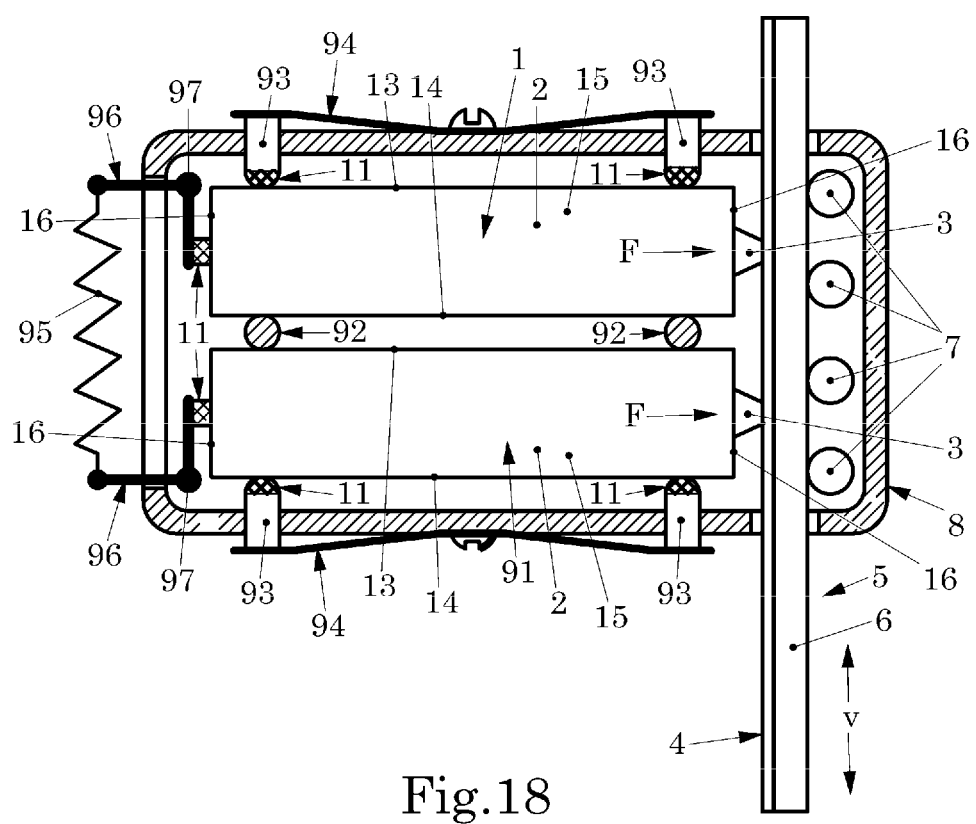

FIG. 18: shows an embodiment of an ultrasonic motor in the form of a linear drive suitable for operation according to the method of the invention.

FIG. 1: shows an embodiment of an ultrasonic motor in the form of a linear drive suitable for operation according to the method of the invention. The ultrasonic motor comprises an ultrasonic actuator 1 in the form of a rectangular piezoelectric plate 2 with two main faces 13 and 14 that are largest in terms of surface area, two side faces 15 extending along the length of the ultrasonic actuator, and two end faces 16 extending along the width of the ultrasonic actuator. Attached at end face 16 facing an element 5 to be driven is a friction element 3 that is pressed by way of a spring element 10 with a force F against friction surface 4 of element 5 to be driven.

Element 5 to be driven is embodied as a body 6 mounted slideable in the longitudinal direction by way of bearing 7 in housing 8.

Ultrasonic actuator 1 is held in housing 8 by clamping elements 9.

The contact force F generated by spring element 10 acts upon ultrasonic actuator 1 via sound-insulating support 11.

In addition to the rod shape of body 5 to be driven shown in FIG. 1, it can also be configured as a plate, as a table or as another similar shape.

The arrows with the index v indicate the direction of motion of element 5 to be driven.

FIG. 2 shows a further embodiment of an ultrasonic motor suitable for operation with the method of the invention in the form of a rotary drive in which element 5 to be driven is configured as a rotary body 12 in the form of a disk.

The rotary body 12 can also be only part of a disk, where other shapes, such as a ring or part of a ring, a cylinder or part of a cylinder and a sphere or part of a sphere are additionally conceivable.

FIG. 3 illustrates the geometric structure or the geometric ratios of an ultrasonic actuator of an ultrasonic motor suitable for operation with the method according to the invention. The ultrasonic actuator has the shape of a rectangular plate 2, where the plate is fabricated entirely of piezoelectric ceramic. Piezoelectric plate 2 has two main faces 13, 14, two side faces 15, and two end faces 16. The plate has length L, width B, and thickness D, where the ratio of length L to thickness D is between 3.5 and 4.5.

The length-to-thickness ratio L/D determines the position of the resonance frequency Fp2 of the second mode of the acoustic bending standing wave, which propagates longitudinally relative to length L and longitudinally relative to thickness D, relative to the resonance frequency Fp1 of the first mode of the acoustic longitudinal standing wave which propagates longitudinally relative to length L.

At a ratio of L/D between 3.5 and 4.5, the resonance frequencies Fp2 and Fp1 are close to each other or coincide.

Width B of piezoelectric plate 2 is greater than its thickness D and smaller than its length L.

Plate 2 can be divided by the virtual vertical plane of symmetry S1, which runs perpendicular to side faces 15 and parallel to end faces 16. Plane of symmetry S1 divides length L and accordingly main faces 13, 14 of plate 2 into two equal parts.

In addition, plate 2 can be divided by virtual longitudinal plane of symmetry S2, which runs perpendicular to end faces 16 and parallel to main planes 13, 14. Plane S2 divides thickness D and accordingly end faces 16 of plate 2 into two equal parts.

Dot and dash lines 17 and 18 illustrate the intersection line of planes of symmetry S1 and S2 with surfaces 13, 14, 15, 16 of plate 2. The two planes S1 and S2 divide plate 2 into the four equal volume regions 19, 20, 21 and 22.

FIG. 4 shows an ultrasonic actuator according to FIG. 3 with a friction element 3 arranged on one of its end faces 16.

Plate 2 of ultrasonic actuator 1 is divided into four equal or identical volume regions 19, 20, 21 and 22, where each volume region together with respective electrodes, not shown in FIG. 4, forms a generator G1, G2, G3, G4 for forming acoustic standing waves and for forming static bending deformations. The respective generator G1, G2, G3, G4 can there be formed by the total volume of the respective volume region 19, 20, 21, 22, or only by a portion of the respective volume region.

FIG. 5 in illustrations 23 to 26 shows different views of an ultrasonic actuator according to FIGS. 3 and 4 with a possible embodiment of the electrodes of the ultrasonic actuator.

While illustrations 23 and 26 show the electrode structure on side faces 15, illustrations 24 and 25 illustrate the electrode structure on main faces 13 and 14.

Individual generators G1, G2, G3 and G4 comprise strip-shaped excitation electrodes 27 and strip-shaped general electrodes 28 which are arranged on main faces 13 and 14 of plate 2, where piezoelectric or piezoceramic material, respectively, is disposed between adjacent strip-shaped electrodes 27, 28. The arrows with the index p indicate the polarization direction of the piezoceramic material between electrodes 27 and 28.

Generator G1 comprises stripe-shaped excitation electrodes 27 and strip-shaped general electrodes 28 which are arranged on main face 13 and can be assigned to volume region 19, as well as the piezoceramic material which is disposed between strip-shaped general electrodes 27 and 28.

Generator G2 comprises stripe-shaped excitation electrodes 27 and strip-shaped general electrodes 28 which are arranged on main face 13 and can be assigned to volume region 20 of plate 2, as well as the piezoceramic material which is disposed between electrodes 27 and 28.

Generator G3 comprises stripe-shaped excitation electrodes 27 and strip-shaped general electrodes 28 which are arranged on main face 14 and can be assigned to volume region 21 of plate 2, as well as the piezoceramic material which is disposed between electrodes 27 and 28.

Generator G4 finally comprises stripe-shaped excitation electrodes 27 and strip-shaped general electrodes 28 which are arranged on main face 14 and can be assigned to volume region 22 of plate 2, as well as the piezoceramic material which is disposed between electrodes 27 and 28.

Strip-shaped excitation electrodes 27 of generator G1 have terminal 29 arranged on side face 15, whereas strip-shaped excitation electrodes 27 of generator G2 have terminal 30 arranged on the same side face 15.

Strip-shaped excitation electrodes 27 of generator G3 have terminal 31, and strip-shaped excitation electrodes 27 of generator G4 have terminal 32, where terminals 31 and 32 are both arranged on the same side face 15 which is disposed opposite the side face on which terminals 29 and 30 are arranged.

General strip-shaped electrodes 28 have terminal 33 which is arranged on both side faces 15.

All strip-shaped electrodes 27 and 28 are arranged parallel to plane of symmetry S1, and the polarization direction of the piezoceramic material of piezoelectric plate 2 between electrodes 27 and 28 runs perpendicular to electrodes 27 and 28.

The distance k between adjacent strip-shaped excitation electrodes 27 and strip-shaped general electrodes 28 is equal to or smaller than half the thickness D of piezoelectric plate 2.

The width m of strip-shaped electrodes 27 and 28 is in the range between 0.1 and 0.5 mm.

Strip-shaped electrodes 27 and 28 can be applied to main faces 13 and 14 of plate 2 in a chemical deposition process of nickel or by vacuum deposition or by thermal deposition of chromium, copper or nickel or also by ion plasma sputtering of chromium, copper, nickel or gold. The structure of strip-shaped electrodes 27 and 28 can be created by laser milling, by lithographic chemical etching, by spraying or in a mask printing process.

The number of strip-shaped electrodes 27 and 28 on surfaces 13 and 14 is limited only by the technological manufacturing possibilities.

In generators G1, G2, G3 and G4 with the strip-shaped excitation electrodes and general electrodes 27 and 28 according to FIG. 5, piezoelectric coefficient $d_{33}$ is used for the excitation of the acoustic standing waves in the ultrasonic actuator.

FIG. 6 in illustrations 34 to 37 shows different views of an ultrasonic actuator according to FIGS. 3 and 4 with a further embodiment of the electrodes of the ultrasonic actuator.

Illustration 34 of FIG. 6 shows a side view of the ultrasonic actuator, illustration 35 shows the view of the bottom side of the ultrasonic actuator, illustration 36 the view of the top side of the ultrasonic actuator and illustration 37 shows the view of side face 15 which is disposed opposite to the side face shown in illustration 34.

Individual generators G1, G2, G3 and G4 in this embodiment of an ultrasonic actuator of an ultrasonic motor according to the invention comprise planar excitation electrodes 38, planar general electrodes 39 and the piezoceramic material arranged between the electrodes.

The planar excitation electrodes 38 are arranged on main faces 13 and 14 spaced from each other, whereas planar general electrode 39 is arranged on inner face 40 of piezoelectric plate 2 which coincides with longitudinal plane of symmetry S2.

The polarization directions of the piezoelectric material of the ultrasonic actuator each run perpendicular to planar electrodes 38 and 39.

Generator G1 comprises planar excitation electrode 38 which is arranged on main face 13 and which can be assigned to volume region 19 of plate 2, and the section, assignable to volume region 19, of planar general electrode 39 which is arranged on inner face 40.

Generator G2 comprises planar excitation electrode 38 which is arranged on main face 13 and which can be assigned to volume region 20 of plate 2, and the section, assignable to volume region 20, of planar general electrode 39 which is arranged on inner face 40.

Generator G3 comprises planar excitation electrode 38 which is arranged on main face 14 and which can be assigned to volume region 21 of plate 2, and the section, assignable to volume region 21, of planar general electrode 39 which is arranged on inner face 40.

Generator G4 comprises planar excitation electrode 38 which is arranged on main face 14 and which can be assigned to volume region 22 of plate 2, and the section, assignable to volume region 22, of planar general electrode 39 which is arranged on inner face 40.

Planar excitation electrodes 38 of generators G1, G2, G3 and G4 each comprise a substantially centrally arranged electric terminal 41, 42, 43 and 44, whereas planar general electrode 39 disposes of two electric terminals 45, where each of the electric terminals is arranged on a side face 15.

In the embodiment of generators G1, G2, G3 and G4 with planar excitation electrodes 38 and planar general electrodes 38 and 39 according to FIG. 6, piezoelectric coefficient $d_{31}$ is used for the excitation of the acoustic standing waves.

Planar excitation electrodes 38 can be manufactured from the materials and according to the technologies as previously described for the strip-shaped excitation electrodes and general electrodes with respect to FIG. 5.

Planar general electrodes 39 are located on inner face 40 and can be made of copper, silver, palladium or an alloy in an inert gas atmosphere by a synthesis process together with the piezoceramic material of piezoceramic plate 2. Planar general electrodes 39 can also be made of electrically conductive ceramic material.

Illustration 46 of FIG. 7 shows a perspective view of the ultrasonic actuator according to FIG. 5 with a friction element 3 arranged on one of its end faces 16; while illustration 47 of FIG. 7 shows a perspective view of the ultrasonic actuator according to FIG. 6 with a friction element 3 arranged on one of its end faces 16. It can there be seen that in both cases friction element 3 is arranged substantially at the center with respect to thickness D and extends over the entire width B of ultrasonic actuator 1.

Illustration 48 of FIG. 8 shows an electric circuit for the operation of ultrasonic actuator 1 according to FIG. 5 with the method according to the invention, where ultrasonic actuator 1 comprises strip-shaped excitation electrodes 27 and strip-shaped general electrodes 28 and the electric circuit comprises separation capacitors C1, C2, C3 and C4 and separation resistors R1, R2, R3 and R4.

The capacity of separation capacitors C1, C2, C3 and C4 is preferably equal to or greater than the electric capacity Co of actuator 1 between electrodes 27 and 28 of generators G1, G2, G3 and G4. Separation resistors R1, R2, R3 and R4 preferably have a value that is 5 to 10 times greater than the characteristic resistance Xo of capacity Co, with Xo=½pFgCo, where Fg is the operating frequency of the ultrasonic motor.

Illustration 49 of FIG. 8 shows a block diagram relating to an electrical excitation device 50 for performing the method according to the invention.

Excitation device 50 comprises a single phase generator 51 for an electric alternating voltage U1 at terminal 52, a switch 53 with terminals 54, 55 and 56, an electric generator 57 for a static electric control voltage Es at terminal 58, linear amplifiers 59 and 60 for a static electric voltage with terminals 61 and 62, where the static electric voltages E1 and E2 are applied, and a controller 63 with an input 64.

All blocks of excitation device 50 have the general output 65.

Control can take place by way of excitation device 50 in the dynamic mode (dynamic operating mode) as well as in the static mode (static operating mode).

With dynamic single-phase control according to FIG. 8 or FIG. 15, respectively, generator 51 provides the electric single-phase alternating voltage U1 with frequency Fg which is equal to frequency Fp2 or equal to frequency Fp1 or is disposed between or close to these frequencies.

On the one hand, voltage U1 is applied via terminal 54 of switch 53 and capacitors C1 and C4 to terminals 29 and 32 of excitation electrodes 27 of generators G1 and G4. On the other hand, voltage U1 is applied via general output 65 to input 33 of general electrodes 28 of generators G1 and G4.

Voltage U1 controls generators G1 and G2 dynamically, where these generators simultaneously generate the second mode of an acoustic bending standing wave in actuator 1 which propagates longitudinally relative to length L and longitudinally relative to thickness D (see also illustrations 66 and 67 in FIG. 9), and the first mode of an acoustic longitudinal standing wave that propagates longitudinally relative to length L (see illustrations 68 and 69 of FIG. 9).

The dotted lines in illustrations 66 and 67 of FIG. 9 show the shape of the maximum deformation of plate 2 when the second mode of the acoustic bending standing wave propagates therein.

The dotted lines in illustrations 68 and 69 of FIG. 9 show the shape of the maximum deformation of plate 2 when the first mode of the acoustic longitudinal standing wave propagates therein.

The superposition of the bending standing wave and the longitudinal standing wave causes point 70 (as well as other points) of friction surface 71 of friction element 3 to continuously move on an elliptical trajectory 72 in the direction indicated with the arrows and index +Vd, as shown in FIG. 10. The shape of the ellipse and its inclination relative to friction surface 4 depend on the ratio L/D chosen.

Elliptical trajectories 72 of point 70 and the other points forming surfaces of friction element 3 are disposed perpendicular to main faces 13 and 14 of piezoelectric plate 2 of actuator 1.

Since friction surface 71 of friction element 3 is pressed by a force F against friction surface 4 of element 5 to be driven, elliptical trajectory 72 leads to a continuous motion of element 5 to be driven in the direction indicated by the arrow by index +Vd.

When actuating switch 53 to the contact position with terminal 56 (dotted line in illustration 49 of FIG. 8), electric voltage U1 reaches terminals 30 and 31 of electrodes 27 and 28 of generators G2 and G3, whereby these generators are dynamically excited.

Generators G2 and G3 thus simultaneously generate the second mode of the acoustic bending standing wave in actuator 1 which propagates longitudinally relative to length L and longitudinally relative to thickness D (see illustrations 66 and 67 of FIG. 9), and the first mode of the acoustic longitudinal standing wave which propagates longitudinally relative to length L (see illustrations 68 and 69 of FIG. 9).

When actuating switch 53, the phase shift between the bending standing wave propagating in actuator 1 and the acoustic longitudinal standing wave changes by 180°. This reverses the direction of motion of points 70 on their trajectories 72, represented by an arrow and index −Vd. This also reverses the direction of motion of element 5 to be driven. The element to be driven then moves in the opposite direction specified by the arrow and index −Vd.

The directions of motion of element 5 to be driven (shown in FIGS. 1, 2, 10, 12 and 18 with the arrow and index V or Vd) run perpendicular to main faces 13 and 14 of piezoelectric plate 2 of actuator 1.

In the dynamic operating mode of the method according to the invention, the drive path of element 5 to be driven is in principle unlimited, while a minimum drive step of element 5 to be driven is determined by the surface roughness of friction surfaces 71 and 4 of friction element 3 and element 5 to be driven. In the optimal case, the length of a drive step is between 0.05 and 0.1 microns.

The static operating mode of the method according to the invention is as follows: first, the dynamic operating mode is stopped by moving switch 53 to the contact position with terminal 55. In this position of switch 53, generators G1, G2, G3 and G4 are no longer dynamically actuated, since electric voltage U1 is not applied to electrodes 27 and 28

The generator for dynamic electric voltage 57 provides the static electric control voltage Es at terminal 58 which can change in the range of +Es by the value 0 to −Es. This voltage is amplified by linear amplifiers 59 and 60.

Static electric voltage E1 is then applied to terminal 61 of amplifier 59 and changes in the range of +E by the value 0 to −E. Inverted static electric voltage E2 is applied to terminal 62 of amplifier 60 and changes in the range between −E and +E.

On the one hand, voltage E1 reaches terminals 29 and 30 of excitation electrodes 27 of generators G1 and G2 via resistors R1 and R2. On the other hand, voltage E1 reaches terminal 33 of general electrodes 28 of generators G1 and G2 via general terminal 65.

Furthermore, voltage E2 reaches terminals 29 and 30 of excitation electrodes 27 of generators G3 and G4 via resistors R3 and R4, and on the other hand, voltage E2 reaches terminal 33 of general electrodes 28 of generators G3 and G4.

Electric voltages E1 and E2 applied to generators G1, G2 and G3, G4 of the actuator cause piezoelectric plate 2 to be statically bent or deformed, as shown by way of the dotted lines in illustrations 73 and 74 of FIG. 11.

The direction of the static bend is determined by the polarity of voltage E1 in relation to the polarity of voltage E2. The magnitude of the static bend is determined by the magnitude of voltages E1 and E2.

If voltage E1 is equal to voltage +E and voltage E2 is equal to voltage −E, then plate 2 bends as shown in illustration 73 of FIG. 11. Point 70 on friction surface 71 of friction element 3 moves on trajectory 75 to position 76, as shown in FIG. 12.

Since friction surface 71 of friction element 3 is pressed by a force F against friction surface 4 of element 5 to be driven, the displacement of point 70 to position 76 leads to a translation of element 5 to be driven by the distance +d in the direction specified by the arrow and index +Vs.

When the polarity changes (E1 equals −E and E2 equals −E), then plate 2 bends as shown in illustration 74 of FIG. 11. In this case, point 70 on friction surface 71 of friction element 3 is displaced on trajectory 75 to position 77 (see FIG. 12).

The displacement of point 70 to position 77 results in a translation of element 5 to be driven by the distance −d in the direction shown by the arrow and index −Vs.

In the static operating mode of the method according to the invention, the maximum displacement of +/−d, i.e. the maximum step length of element 5 to be driven, is determined by the maximum value of voltages E1 and E2. The maximum step length can reach values between 0.1 and 1 μm.

The minimum step length is determined by the stiffness of the structure of clamping elements 9. It can range from 0.1 to 1 nm.

The dynamic operating mode of the method according to the invention can also be realized by way of an electric two-phase voltage Illustrations 78 and 79 of FIG. 13 show a corresponding electric circuit and a corresponding block diagram, respectively.

With two-phase control, generator 80 provides two electric alternating voltages U1 and U2 with the same frequency Fg for terminals 81 and 82.

Voltages U1 and U2 are shifted relative to each other by the phase angle fg +/−90° or by an angle differing therefrom.

On the one hand, voltage U1 is applied via terminal 81 and capacitors C1 and C4 to terminals 29 and 32 of excitation electrodes 27 of generators G1 and G4, and, on the other hand, voltage U1 reaches terminal 33 of general electrodes 28 of generators G1 and G4 via general terminal 65.

Furthermore, voltage U2 is applied via terminal 82 and capacitors C2 and C3 to terminals 30 and 31 of excitation electrodes 27 of generators G2 and G3, and voltage U2 reaches terminal 33 of general electrodes 28 of generators G2 and G3 via general terminal 65.

Each of the two pairs of generators G1, G4 and G2, G3 simultaneously generate the second mode of the acoustic bending standing wave in actuator 1 which propagates longitudinally relative to length L and longitudinally relative to thickness D (see illustrations 66 and 67 of FIG. 9), and the first mode of the acoustic longitudinal standing wave which propagates longitudinally relative to length L (see illustrations 68 and 69 of FIG. 9).

The superposition of the acoustic bending standing wave and the acoustic longitudinal standing wave causes point 70 of friction surface 71 of friction element 3 to continuously move on an elliptical trajectory 72, as shown in FIG. 10. This leads to element 5 to be driven to be displaced or driven, respectively.

Reversing the phase shift angle fg changes the direction of motion of the element to be driven.

Furthermore, in the method according to the invention, the dynamic operating mode can be realized with an electric two-phase voltage with the independent simultaneous generation of acoustic standing waves by two pairs of generators, such as G1 and G3 as well as G2 and G4. Illustrations 83 and 84 of FIG. 14 show a corresponding electric circuit for this form of excitation.

In this case, generators G1 and G3 form inversely phased generators and generators G2 and G4 represent in-phase generators.

The pair of generators G1, G3 generates the second mode of an acoustic bending standing wave in actuator 1 which propagates longitudinally relative to length L and longitudinally relative to thickness D (see illustrations 66 and 67 of FIG. 9). The pair of generators G2, G4 generates the first mode of an acoustic longitudinally standing wave in actuator 1 which propagates longitudinally relative to length L (see illustrations 68 and 69 of FIG. 9).

The superposition of the acoustic bending and the longitudinal standing wave leads to points 70 of friction surface 71 of friction element 3 according to FIG. 10 to evenly move on elliptical trajectory 72. This results in a drive motion of element 5 to be driven.

Illustrations 85 and 86 of FIG. 15 show an electric circuit for the realization of the method according to the invention with an ultrasonic actuator 1 in which generators G1, G2, G3 and G4 comprise planar excitation electrodes 38 and planar general electrodes 39 according to illustration 47 of FIG. 7. The dynamic operating mode is there effected by way of electric single-phase voltage U1.

The operating principle of the circuit according to FIG. 17 is analogous to the operating principle shown in FIG. 8.

Illustrations 87 and 88 of FIG. 16 show an electric circuit for the realization of the dynamic operating mode of the method according to the invention by way of an electric two-phase voltage U1, U2, where generators G1, G2, G3, G4 of actuated ultrasonic actuators 1 comprise planar excitation electrodes 38 and planar general electrodes 39.

The operating principle of the circuit according to FIG. 16 is analogous to the operating principle shown in FIG. 13.

Illustrations 89 and 90 of FIG. 17 show an electric circuit for the realization of the dynamic operating mode of the method according to the invention by way of an electric two-phase voltage U1, U2, where generators G1, G3, and G2, G4 are excited independently of each other The operating principle of the circuit according to FIG. 17 is analogous to the operating principle shown in FIG. 14.

FIG. 18 shows an ultrasonic motor suitable for operation according to the method of the invention which, in addition to main ultrasonic actuator 1, comprises an additional ultrasonic actuator 91.

In this motor configuration, clamping elements 92 fixedly attached to motor housing 8 are used for securing actuators 1 and 91. Actuators 1 and 91 are pressed against clamping elements 92 from two opposite sides with the aid of stops 93 and flat springs 94. Stops 93 touch actuators 1 and 91 in the minima of the oscillation speeds of the bending standing waves.

Pressing friction elements 3 of actuators 1 and 91 against friction surface 4 of element 5 to be driven is performed by spring 95 which acts upon actuators 1 and 91 by way of levers 96 mounted in axes 96.

It is thus possible to precisely balance the forces F which press the friction elements 3 of actuators 1 and 91 against friction surface 4 of element 5 to be driven.

The invention claimed is:

1. A method for operating an ultrasonic motor, comprising:
providing an ultrasonic actuator formed as a plate made of piezoelectric or electrostrictive or magnetostrictive material whose width B is greater than its thickness D and smaller than its length L, said plate including two main faces, two side faces extending along the length, and two end faces extending along the width, and having a transverse plane of symmetry S1 which runs perpendicular to said two main faces and said two side faces and parallel to said two end faces, and a longitudinal plane of symmetry S2 which runs perpendicular to said two side faces and said two end faces and parallel to said two main faces;
a friction element configured for contacting an element to be driven arranged on at least one of said two end faces of said ultrasonic actuator; and at least four identical volume regions arranged symmetrically in relation to said transverse plane of symmetry S1 as well as symmetrically in relation to said longitudinal plane of symmetry S2, each of said at least four identical volume regions together with excitation electrodes and general electrodes arranged on and/or in said ultrasonic actuator forming a generator for forming acoustic standing waves as well as static bending deformations;
providing an electrical excitation device for delivering one electric alternating voltage U1 or two electric alternating voltages U1, U2 and two static electric voltages E1, E2; and
applying said one alternating voltage U1 to said excitation electrodes and said general electrodes of two of said four generators or applying one of said two alternating voltages U1, U2 to said excitation electrodes and said general electrodes of two of said four generators and applying the other of said two alternating voltages U1, U2 to said excitation electrodes and said general electrodes of the other two of said four generators for forming an acoustic standing wave in said ultrasonic actuator in a dynamic operating mode, or applying one of said two static electric voltages E1, E2 to said excitation electrodes and said general electrodes of two of said four generators and applying the other of said two static electric voltages E1, E2 to said excitation electrodes and general electrodes of the other two of said four generators for forming a static bending deformation in a static operating mode.

2. The method according to claim 1, wherein in the dynamic operating mode, when applying said two alternating voltages U1, U2, each of two pairs of said four generators, to which a same alternating voltage U1, U2 is applied, forms an acoustic standing wave in said ultrasonic actuator which corresponds to a superposition of a second mode of a bending standing wave and a first mode of a longitudinal standing wave.

3. The method according to claim 1, wherein in the dynamic operating mode, when applying said two alternating voltages U1, U2, one of two pairs of said four generators, to which one of said alternating voltages U1, U2 is applied, forms an acoustic standing wave in said ultrasonic actuator which corresponds to a second mode of a bending standing wave, and another of said two pairs of said four generators, to which said other alternating voltage U1, U2 is applied, forms an acoustic standing wave in said ultrasonic actuator which corresponds to a first mode of an acoustic longitudinal standing wave.

4. The method according to claim 1, wherein static bending deformation of said ultrasonic actuator occurs in a plane that runs substantially parallel to said two end faces.

\* \* \* \* \*